(12) United States Patent
Dentoni Litta et al.

(10) Patent No.: US 11,367,662 B2
(45) Date of Patent: Jun. 21, 2022

(54) SEMICONDUCTOR DEVICES AND METHODS OF FORMING THE SAME

(71) Applicant: IMEC vzw, Leuven (BE)

(72) Inventors: Eugenio Dentoni Litta, Leuven (BE); Yusuke Oniki, Leuven (BE); Lars-Ake Ragnarsson, Heverlee (BE); Naoto Horiguchi, Leuven (BE)

(73) Assignee: IM EC vzw, Leuven (BE)

( * ) Notice: Subject to any disclaimer, the term of this patent is extended or adjusted under 35 U.S.C. 154(b) by 0 days.

(21) Appl. No.: 16/938,168

(22) Filed: Jul. 24, 2020

(65) Prior Publication Data
US 2021/0028068 A1 Jan. 28, 2021

(30) Foreign Application Priority Data

Jul. 24, 2019 (EP) .................................... 19188136

(51) Int. Cl.
*H01L 21/8238* (2006.01)
*H01L 27/092* (2006.01)
(Continued)

(52) U.S. Cl.
CPC ........... *H01L 21/823821* (2013.01); *H01L 21/823828* (2013.01); *H01L 27/0924* (2013.01);
(Continued)

(58) Field of Classification Search
CPC ..... H01L 21/823821; H01L 21/823828; H01L 27/0924; H01L 29/42392; H01L 29/66545; H01L 29/6656; H01L 29/6681
See application file for complete search history.

(56) References Cited

U.S. PATENT DOCUMENTS 6,406,962 B1 6/2002 Agnello et al.
9,570,551 B1 2/2017 Balakrishnan et al.
(Continued)

FOREIGN PATENT DOCUMENTS

WO WO 2018/063365 A1 4/2018

OTHER PUBLICATIONS

Weckx et al., "Stacked nanosheet fork architecture for SRAM design and device co-optimization toward 3nm," 2017 IEEE International Electron Devices Meeting (IEDM), San Francisco, CA, 2017, pp. 20.5.1-20.5.4.
(Continued)

*Primary Examiner* — Christine A Enad
(74) *Attorney, Agent, or Firm* — Knobbe, Martens, Olson & Bear, LLP

(57) ABSTRACT

The disclosed technology generally relates to semiconductor devices and methods of forming the same. In one aspect, a method of forming a semiconductor device having a first field-effect transistor (FET) device and a second FET device comprises forming the first and second FET devices from a first stack and a second stack comprising a channel material arranged on a sacrificial material. The method can include forming first spacers at sidewalls of the first and second stacks, and forming a second spacer between the first spacers. After recessing of the sacrificial material and removal of the first spacers, gate structures may be formed, wrapping around the at least partly released channel portions. The gate structure of the first transistor device can be separated from the gate structure of the second transistor device by the second spacer.

17 Claims, 9 Drawing Sheets

(51) Int. Cl.
H01L 29/423 (2006.01)
H01L 29/66 (2006.01)
(52) U.S. Cl.
CPC .... *H01L 29/42392* (2013.01); *H01L 29/6656* (2013.01); *H01L 29/6681* (2013.01); *H01L 29/66545* (2013.01)

(56) References Cited

U.S. PATENT DOCUMENTS

| | | | |
|---|---|---|---|
| 10,263,100 | B1 | 4/2019 | Bi et al. |
| 10,510,620 | B1* | 12/2019 | Chanemougame ........................ H01L 29/0692 |
| 2017/0117359 | A1 | 4/2017 | Cheng et al. |
| 2017/0148907 | A1* | 5/2017 | Wu .................... H01L 29/66484 |
| 2018/0040695 | A1 | 2/2018 | Smith et al. |
| 2019/0035888 | A1 | 1/2019 | Wu |
| 2019/0131431 | A1* | 5/2019 | Cheng .................... B82Y 10/00 |
| 2019/0341482 | A1* | 11/2019 | Wu ...................... H01L 29/1054 |
| 2019/0355724 | A1* | 11/2019 | Chiang ................. H01L 21/324 |
| 2020/0035567 | A1* | 1/2020 | Chanemougame ........................ H01L 29/78654 |
| 2020/0058653 | A1* | 2/2020 | Chiang ........... H01L 21/823821 |

OTHER PUBLICATIONS

Extended European Search Report dated Nov. 29, 2019 in counterpart European Application No. 19188136.6 in 11 pages.

\* cited by examiner

SEMICONDUCTOR DEVICES AND METHODS OF FORMING THE SAME

CROSS-REFERENCE TO RELATED APPLICATIONS

This application claims foreign priority to European Patent Application No. EP 19188136.6, filed Jul. 24, 2019, the content of which is incorporated by reference herein in its entirety.

BACKGROUND

Technical Field

The disclosed technology generally relates to semiconductor devices and more particularly to methods of forming semiconductor devices such as field-effect transistor (FET) devices.

Description of the Related Technology

In striving to provide more power- and area-efficient circuit designs, new transistor devices are being developed.

Horizontal channel field effect transistor (FET) devices include the fin field-effect transistor (finFET), which can have a gate straddling a channel portion of a fin-shaped semiconductor structure, and the horizontal nanowire- or nanosheet-FET (horizontal NWFET or NSFET), which can have a gate at least partly enclosing a channel portion of a horizontally oriented nanowire- or nanosheet-shaped semiconductor structure.

Efficient process flows dedicated to fabrication of horizontal channel FET devices have been developed. However, the objective of developing more area efficient FET devices still remains.

SUMMARY OF CERTAIN INVENTIVE ASPECTS

An objective of the disclosed technology is to provide a method allowing for shorter spacing between FET devices formed on a common substrate.

According to an aspect of the disclosed technology, a method of forming a semiconductor device comprises:
  forming a first field-effect transistor (FET) device comprising a first semiconductor structure including a first source region, a first drain region, a first channel portion extending horizontally between the first source/drain regions, and a first gate structure at least partly wrapping around the first channel portion;
  forming a second FET device comprising a second semiconductor structure including a second source region, a second drain region, a second channel portion extending horizontally between the second source/drain regions, and a second gate structure at least partly wrapping around the second channel portion;
  wherein forming the first and second FET devices comprises:
    forming, on a semiconductor substrate, a first stack and a second stack separated by a trench, wherein each one of the first and second stacks comprises a first layer arranged on a second layer, wherein the first layer comprises a channel material forming the respective first and second semiconductor structures, and wherein the second layer comprises a sacrificial material;
    forming, in the trench, first spacers at sidewalls of the first and second stacks;
    forming a second spacer between the first spacers;
    forming a sacrificial gate extending across the first and second channel portions, the first spacers and the second spacer;
    recessing the sacrificial material at the source/drain regions;
    forming source/drain portions at the source/drain regions;
    removing the sacrificial gate;
    removing the first spacers;
    etching the sacrificial material of the first and second stacks to form at least partly released first and second channel portions of the channel material; and
    forming gate structures at least partly wrapping around the at least partly released channel portions, the gate structure of the first transistor device being separated from the gate structure of the second transistor device by the second spacer.

The distance at which two neighboring transistor devices may be formed on a same substrate, in some cases, may be limited by the risk of interference between the transistor devices. Another factor may be that neighboring transistors of different polarity may be treated separately during at least some steps of the production. If the devices are formed too closely together, the processing of one (or some) transistor device(s) may affect neighboring devices.

In some embodiments of the disclosed technology, the second spacer may act as a wall between neighboring transistor devices. The wall may aid in electrically separating (e.g., insulating) the first FET device from the second FET device, which may allow for a reduction of the spacing between the first and second FET device.

The first spacers formed at the sidewalls of the trench may allow the second spacer to be formed self-aligned between the stacks. For example, the width of the first spacers formed at the sidewalls of the trench may define the placement of the second spacer relative to the stacks. Such an alignment of the second spacer may, compared to a purely litho-defined spacer, provide a more precise positioning and width of the second spacer. In some instances, the first spacers may allow the second spacer to become centered in the trench. As the first spacers may be removed, a gate structure may be formed at least partially within the space left between the channel portions and the stacks by removing the first spacers, which may in turn provide that the gate structures may at least partially wrap around the channel portions.

For example, some embodiments of the disclosed technology may allow the forming of a self-aligned second spacer (e.g., wall) between the channel portions of two neighboring FET devices.

Such a wall may be an insulating wall. Such a wall may be a dielectric wall. For example, such a wall may comprise silicon nitride (SiN) based material, a silicon-carbon-oxygen (SiCO)-based material, silicon carbon nitride (SiCN), or silicon carbide (SiC).

In some implementations, the self-alignment of the wall may provide reduced requirements on tolerances in the process of defining the width of the stacks. For example, in some instances, the location of the second spacer (e.g., wall) may be dependent on the location of the stacks and the thickness of the first spacers.

As used herein, a horizontal channel FET device may refer to a device comprising a semiconductor structure comprising a first and a second source/drain portion and a channel portion located intermediate and extending horizontally between the first and second source/drain portions, and further comprising a gate structure extending horizontally along the channel portion. In a horizontal channel FET device, the first and second source/drain portions and the channel portion may intersect a common horizontal plane. The channel portion can be adapted to (in use of the device) conduct a horizontally oriented flow of charge carriers between the source/drains.

As used herein, vertical may refer to a direction or orientation (e.g. of a surface, a dimension or other feature) parallel to a normal to the substrate (e.g., a main plane of extension or main/upper surface thereof). As used herein horizontal may refer to a direction or orientation parallel to the substrate (e.g., a main plane of extension or main surface thereof), or transverse to the vertical direction. Meanwhile, terms such as "above", "upper", "top" and "below", "lower", "bottom" can refer to relative positions as viewed along the vertical direction, and does not imply an absolute orientation of the substrate or device.

According to some embodiments, first spacers may also be formed at the first and second stacks at sidewalls facing away from the trench. In some implementations, the gate structures may be formed wrapping (completely in various instances) around the released channel portions.

In some embodiments, the second spacer may be formed between each one of a plurality of stacks at a distance from the channel portions. For example, the second spacers may be formed symmetrically in the trenches between each one of a plurality of stacks. In some embodiments, the stacks may be evenly spaced (e.g., at even intervals). As used herein, reference to "each" of a particular element (e.g., "each one of a plurality of stacks") may refer to two or more of the elements, and may or may not refer to every one of the elements in the device. For example, "each one of a plurality of stacks" may refer to individual ones of a plurality of stacks and not necessarily every single stack in the device.

The distance between the second spacer and the channel portions may allow for the channel portions to be released, and for gate structures to be formed wrapping (fully in various instances) around the channel portions. For example, the distance between the wall and the channel portions may allow the forming of a gate-all-around (GAA) structure, which may reduce the operating voltage of the FET device.

According to some embodiments, the method may comprise forming a third FET device which may comprise a third semiconductor structure that may include a third source region, a third drain region, a third channel portion which may extend horizontally between the third source and drain regions, and a third gate structure which may wrap partly around the third channel portion in some instances.

Forming the third FET device may comprise forming a third stack on the semiconductor substrate. The third stack may be separated from the second stack by a second trench. The third stack may comprise a first layer which may be arranged on a second layer. The first layer may comprise a channel material, which may form the third semiconductor structure. The second layer may comprise a sacrificial material.

Forming the third FET device may comprise forming a further second spacer filling the second trench. Forming the third FET device may include forming the sacrificial gate across the third channel portions and the further second spacer. It may include etching the sacrificial material of the third stack to form partly released third channel portions of the channel material. The gate structure of the second transistor may be separated from the gate structure of the third transistor by the further second spacer.

In the disclosed technology, the further second spacer may be formed at the boundary between two adjacent FET devices (e.g., formed from the second and the third stack). As no first spacers are formed in the trench between the second and third stacks and the further second spacer in various implementations, the channel portions of the second and third stacks may become partly released. In some instances, the gates of the second and third FET devices may wrap partly around the respective channel portions.

In some embodiments, the FET devices may be arranged in pairs connected by a wall formed by the further second spacer. Between two successive pairs of FET devices, at sides at which the gates may wrap around the channel portions, the second spacer may form a wall, at a distance from the channel portions, separating the pairs.

Some such structures may allow for the spacing between two adjacent FET devices to be further decreased, as the space between the wall and the channel portion has been removed.

According to some embodiments, each of the first and second channel portions may be a nanosheet or a nanowire. A nano sheet may refer to a sheet-like nanostructure having a length and width which is significantly larger than its thickness which may be in a range from 1 to 100 nm (e.g., about 1 to about 100 nm), such as for example 5 to 30 nm (e.g., about 5 to about 30 nm). A nanosheet may be referred to as a two-dimensional nanostructure, even though it may have a thickness of for example 4 to 6 nm (e.g., about 4 to about 6 nm). A nanowire may refer to a nanostructure in which the length exceeds the width, or thickness. The width may for example be 4 to 8 nm (e.g., about 4 to about 8 nm).

According to some embodiments, each of the first and second channel portions may be a nanofin.

According to some embodiments, each of the first and second stacks may comprise a plurality of channel material layers and a plurality of sacrificial material layers forming a superlattice. A superlattice formation of the channel portions may in some instances, provide a final transistor device with multiple parallel channels, which may increase the performance of the final transistor device.

According to some embodiments, the second spacer may be formed to fill a gap between the first spacers. For example, the second spacer may be formed to fill the remainder of the trench between the first spacers.

According to some embodiments, the source/drain portions may be formed at the source/drain regions by epitaxial growth. For example, the source/drain portions may be formed at opposite ends of the channel portions, on opposite sides of the sacrificial gate.

According to some embodiments, the first FET device may be an n-type device, and the second FET device may be a p-type device.

For example, the FET devices may be complementary transistors. In some embodiments, the electrical separation which may be provided by the second spacer may allow a reduced spacing of the FET devices.

In some embodiments, the ability of processing the FET devices separately during production may be important. The second spacer may for example provide an increased tolerance in width and placement of mask layers to etch material of one FET region, and not the other, as the second spacer may itself act as part of the mask.

In some embodiments, both the first FET device and the second FET device may be n-type devices. Or, both the first FET device and the second FET device may be p-type devices.

In some embodiments having a third transistor device, the third transistor device may be an n-type device or a p-type device.

According to some embodiments, forming the gate structures may comprise forming a p-type effective work function metal (WFM) on the first and second channel portions. Forming the gate structures may comprise selectively removing the p-type WFM from the second channel portions. The step may comprise forming an n-type WFM on the second channel portions, which may be followed by forming a first gate electrode in contact with the first channel portions and a second gate electrode in contact with the second channel portions.

In some embodiments, selectively removing a p-type (or n-type) WFM from the first channel portions, and leaving the p-type (or n-type) WFM for the second channel portions, may be aided by the second spacer, as the second spacer may act as a barrier beyond which no etching (or deposition) is performed. For example, as previously mentioned, the second spacer may act as part of a mask. In some implementations, a closer proximity of n-type and p-type devices may be allowed.

In some embodiments, the second spacer may facilitate electrical separation (e.g., isolation) of the gate electrodes of the first transistor device and the second transistor device.

According to some embodiments, forming the first stack and the second stack may comprise providing the first layer and the second layer in the shape of a fin, and cutting the fin into the first stack and the second stack via the trench.

In some embodiments comprising more than one stack, further trenches may be cut into the fin, resulting in more stacks.

According to some embodiments, the method may comprise providing a sacrificial layer of sacrificial material on top of the first and second stacks (e.g., prior to forming the first spacers), and removing the sacrificial layer (e.g., after forming the second spacer). The second spacer may protrude above a surface level of the remaining first and second stacks.

As the wall may protrude above a surface level of the remaining first and second stacks, further electrical separation between neighboring FET devices may be provided.

The higher wall (e.g., second spacer protruding above a surface level of the remaining first and second stacks) may facilitate the use of the second spacer as part of an etching mask.

A wall protruding above the surface level of the remaining stacks (or the upper channel portion) may, for example, provide that a shallower etch may be used for separating gate contacts connected respectively to the first FET device and the second FET device.

According to some embodiments, the channel material may be silicon, and the sacrificial material may be silicon germanium.

Such a combination of materials in some instances may allow for selective removal of the sacrificial material while leaving the channel material.

In some embodiments, the channel material may be silicon germanium (SiGe) and the sacrificial material may be silicon (Si).

The channel material may be silicon germanium with a first concentration of germanium ($SiGe_x$) and the sacrificial material may be silicon germanium with a second concentration of germanium, different from the first concentration ($SiGe_y$).

Another combination may be using germanium (Ge) as the channel material, and silicon germanium (SiGe) as the sacrificial material.

Some embodiments may comprise a combination of channel/sacrificial materials wherein one material is from group (or family) III in the periodic table, and the other material is from group (or family) V in the periodic table. For example, the channel material may be from group III, also known as the boron group or triels, which comprises boron (B), aluminum (Al), gallium (Ga) and indium (In). The sacrificial material may be from group V, also known as the nitrogen group or pnictogens, which comprises nitrogen (N), phosphorus (P), arsenic (As) and antimony (Sb). In some embodiments, the channel material may be selected from group V and the sacrificial material selected from group III.

According to another aspect of the disclosed technology, a semiconductor device, comprises:
 a first field-effect transistor (FET) device comprising a first channel portion extending horizontally between source/drain portions of the first FET device, and a first gate structure at least partly wrapping around the first channel portion;
 a second FET device comprising a second channel portion extending horizontally between source/drain portions of the second FET device, and a second gate structure at least partly wrapping around the second channel portion;
 wherein the first FET device and the second FET device are arranged beside each other on a substrate and separated from each other by a spacer; and
 wherein the spacer is arranged between the first FET device and the second FET device and at a distance from the first and second channel portions.

In some semiconductor devices, the spacer may facilitate separate treatment of the first FET device and the second FET device during production. Facilitating the ability of treating the FET devices separately, may allow a decrease in the spacing between the FET devices. For example, some such semiconductor devices may improve area utilization.

In some implementations, the second spacer (e.g., wall) may improve electrical insulation between the two neighboring FET devices. If the electrical insulation improves, the spacing between the first and second FET devices may be further reduced.

According to some embodiments, each of the first and the second channel portions may be a nanosheet or a nanowire.

According to some embodiments, the first FET device may comprise a plurality of first channel portions arranged above each other. The first gate structure may wrap around (at least partly or completely) each of the first channel portions. The second FET device may comprise a plurality of second channel portions arranged above each other. The second gate structure may wrap around (at least partly or completely) each of the second channel portions.

According to some embodiments, the second spacer may be arranged to protrude above a surface level of the first and the second gate structures.

Some such embodiments may provide further electrical separation between the first and second FET devices.

It is noted that other embodiments using all possible combinations of features recited in the above described embodiments may be envisaged. Thus, the disclosed technology also relates to all possible combinations of features mentioned herein. Any embodiment described herein may be combinable with other embodiments also described herein, and the disclosed technology relates to all combinations of features.

Further, features and/or possible results described more in depth with reference to the methods of forming a semiconductor device of the disclosed technology, may also apply to similar features of the semiconductor devices of the disclosed technology, and vice versa.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

With reference to FIGS. 1-13, a method of forming a semiconductor device will now be described.

Reference will throughout be made to a first field effect transistor (FET) region 10 and a second FET region 20. The first and second FET regions 10, 20 can be regions comprising horizontal FET devices.

FIGS. 1-7 show in perspective sections of a substrate 100 comprising a first FET region 10 and a second FET region 20 during different stages of forming semiconductor structures. FIGS. 8-13 show cross sections of the substrate 100 with the semiconductor structures taken across channel portions of the first FET region 10 and the second FET region 20.

As may be appreciated, the substrate 100 and the first and second FET regions 10, 20 may typically present a much greater lateral/horizontal extension than shown, beyond the illustrated section. It may further be noted that the relative dimensions of the shown structures, for instance the relative thickness of layers, is merely schematic and may, for the purpose of illustrational clarity, differ from a physical device structure.

Figure 1:
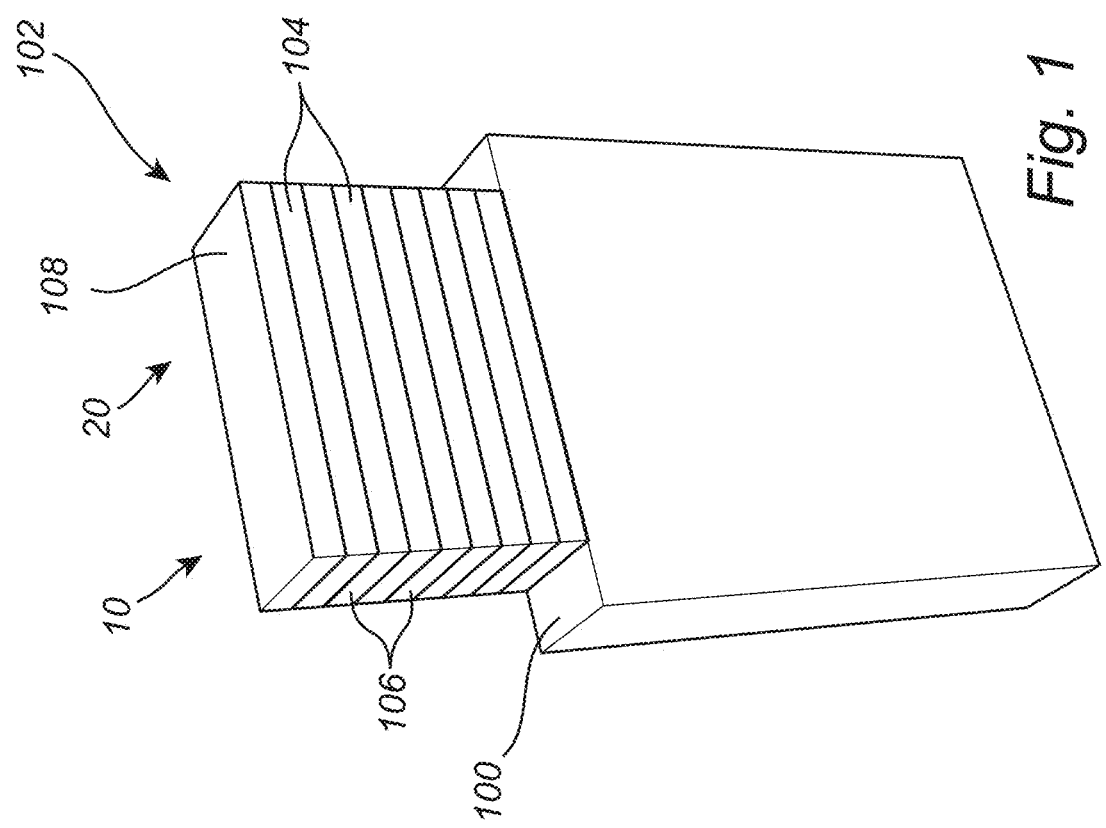

FIG. 1 shows a starting substrate 100. The substrate 100 can be a semiconductor substrate, e.g., a substrate comprising at least one semiconductor layer. The substrate 100 may be a single-layered semiconductor substrate, for instance formed by a bulk substrate. The substrate may however also be a multi-layered substrate, for instance formed by an epitaxially grown semiconductor layer on a bulk substrate, or a semiconductor-on-insulator (SOI) substrate.

As further shown in FIG. 1, a fin structure 102 can be formed on the substrate 100. The fin structure 102 can be formed of alternating channel material layers 104 and sacrificial material layers 106 forming a superlattice. The fin structure 102 can comprise a top layer 108, e.g., a topmost layer of the fin structure 102. The top layer 108 can comprise the sacrificial material.

The channel material layers 104 may be silicon (Si), and the sacrificial material layers 106 and the top layer 108 may be silicon germanium (SiGe). Alternatively, the channel material layers 104 may be silicon germanium (SiGe) and the sacrificial material layers 106 and the top layer 108 may be silicon (Si). Alternatively, the channel material layers 104 may be germanium (Ge) and the sacrificial material layers 106 and the top layer 108 may be silicon germanium (SiGe).

Figure 2:
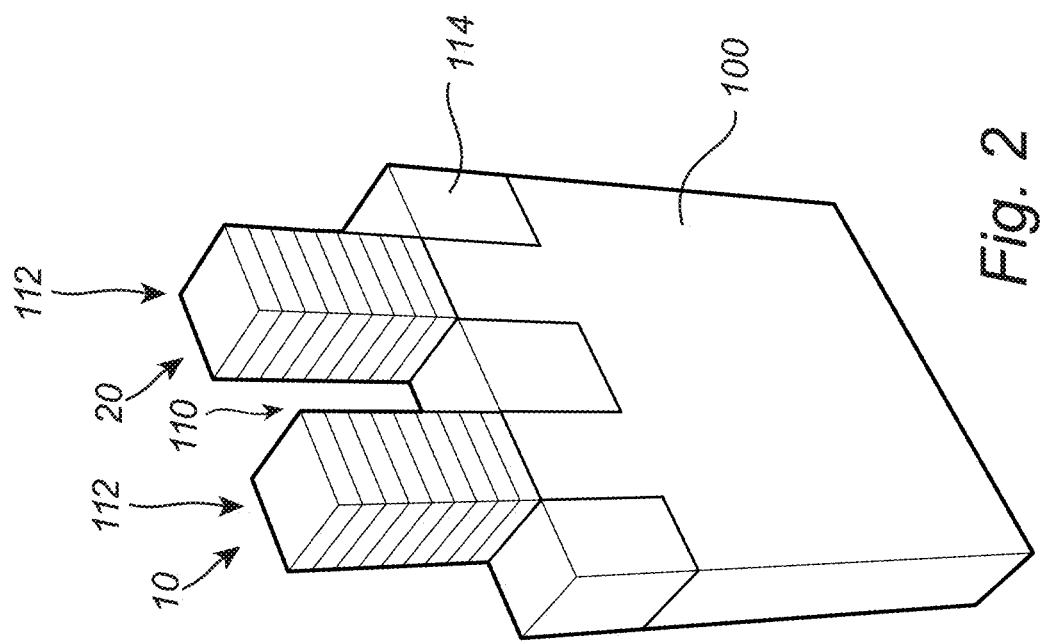
FIGS. 1, 2, 3, 4, 5, 6, 7, 8, 9, 10, 11, 12, and 13 illustrate various intermediate structures of a method of forming a semiconductor device.

In FIG. 2, trenches have been formed in the fin structure. The trenches may as shown extend completely through the fin structure, into an underlying thickness portion of the substrate 100. The fin structure can be partitioned into two stacks 112, one in the first FET region 10 and one in the second FET region 20, separated by a trench 110.

As shown in FIG. 2, trenches formed in the underlying thickness portion of the substrate 100 may be filled with an isolating material 114, e.g., separating the regions of the substrate 100 on which the stacks 112 of the first FET region 10 and the second FET region 20 using shallow-trench-isolation (STI).

Figure 3:
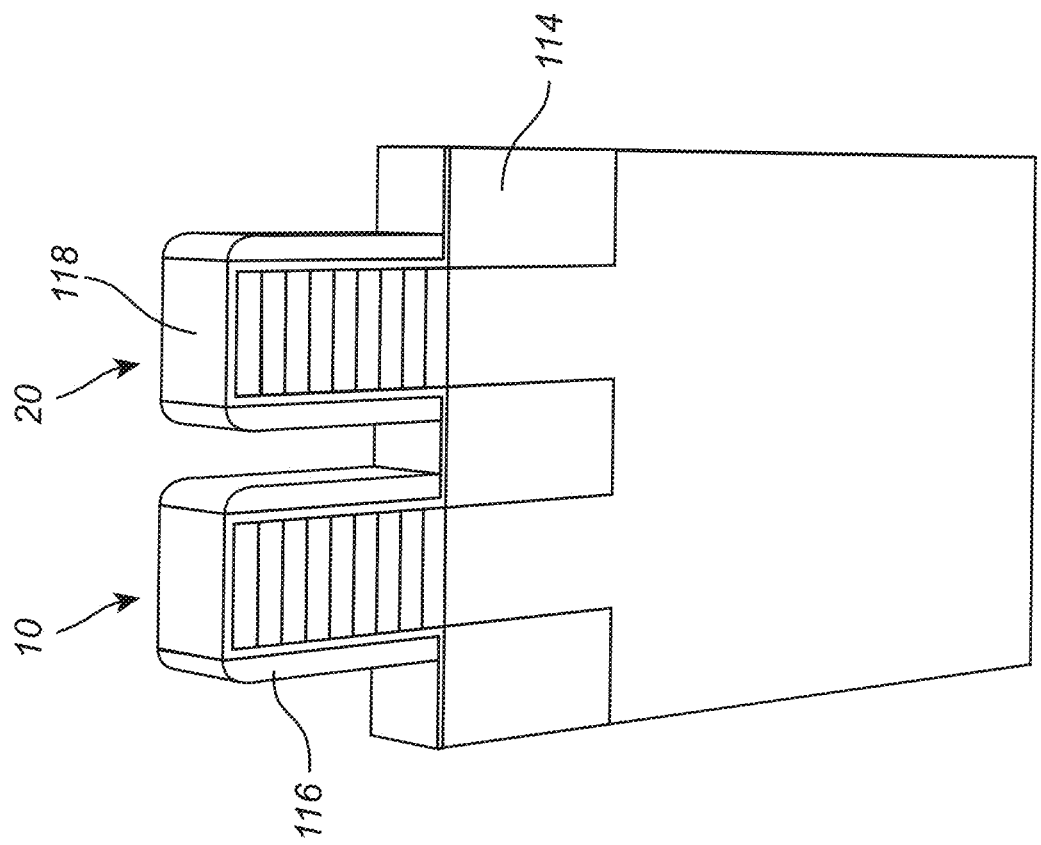

In FIG. 3, first spacers 116 have been formed on sidewalls of the stacks 112 facing the trench 110, and on sidewalls opposite to the sidewalls facing the trench. Optionally, a dummy oxide layer 118 may be formed over the isolating material 114 and the stacks 112, e.g., before forming the first spacers 116.

For example, the material of the first spacers may be conformally deposited over stacks (stacks 112 in FIG. 2), or over the dummy oxide layer 118, before being anisotropically (top-down) etched to form the first spacers 116. The first spacers may for instance be formed of SiGe, which in some examples may comprise the same Si/Ge concentration as the material that may be used in the stacks. The SiGe may be deposited over the dummy oxide layer by chemical vapor deposition (CVD). The first spacers material may also be formed of Ge, which may be conformally deposited by for example atomic layer deposition (ALD) or CVD.

Figure 4:
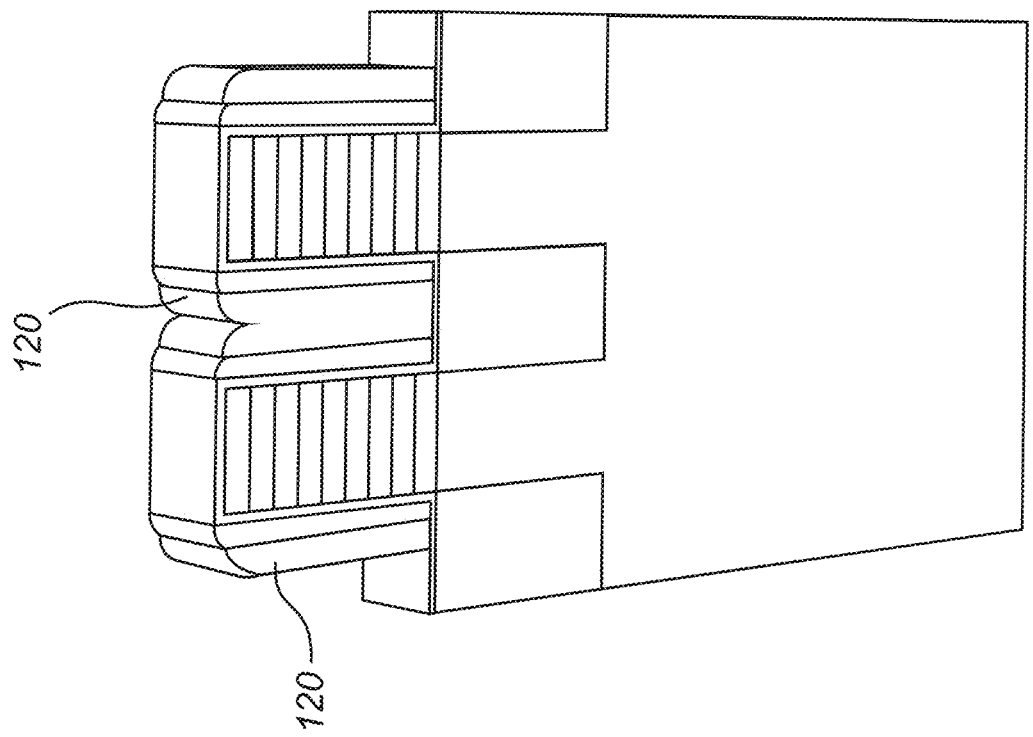

In FIG. 4, second spacers 120 have been formed between the first spacers 116 in the trench, filling the space between the first spacers in the trench, and on sides of the first spacers on sidewalls facing away from the trench.

For example, the second spacer material may be conformally deposited before being anisotropically (top-down) etched to form second spacers 120. The second spacer material may for example be SiN, SiCO, or SiCN. In some instances, the second spacer material can be conformally deposited by for example ALD and CVD.

Figure 5:
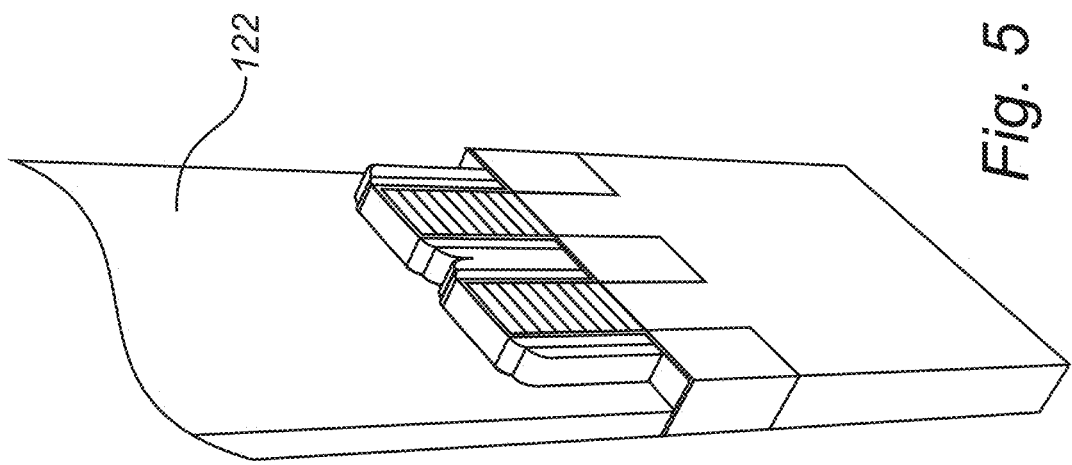

In FIG. 5, a sacrificial gate 122 is formed extending across channel portions of the stacks 112, and across the first spacers 116 and the second spacers 120. Channel portions of the stacks can be portions which will form channel portions of the finished FET devices. The channel portions may be formed by the channel material layers 104 and extend across each stack, from the trench to the first spacer on the opposite side of the stack.

The sacrificial gate 122 may for example comprise amorphous silicon (aSi) or SiGe, and may for example be formed by CVD followed by patterning using an anisotropic etch.

Figure 6:
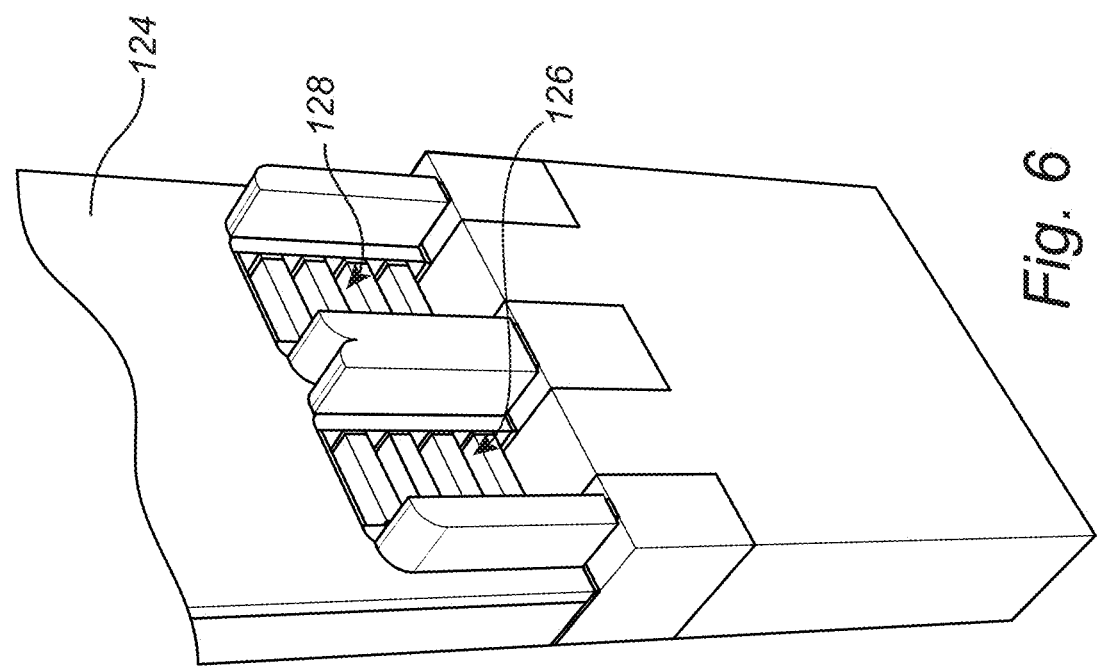

In FIG. 6, a mask layer 124, also referred to as gate spacer, has been formed, and the dummy oxide layer and the first spacers (e.g., dummy oxide layer 118 and first spacers 116 as described with reference to FIG. 3) have been recessed back at the source/drain regions using the mask layer 124. The first spacers and the sacrificial material layers of the stacks have been etched back (e.g., recessed) further, to reveal the source/drain regions 126, 128 of the channel material layers. For example, the source/drain regions 126, 128 can comprise end portions of the channel material layers.

Figure 7:
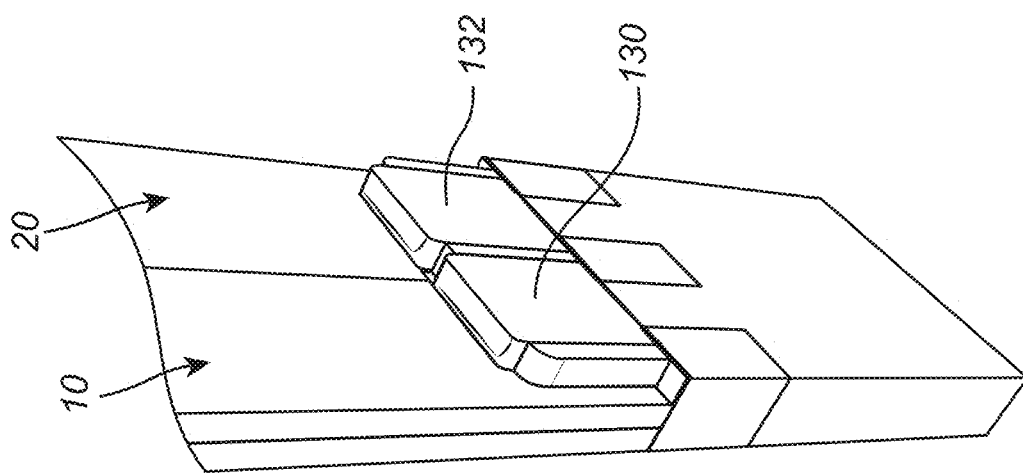

In FIG. 7, source/drain portions 130, 132 have been formed at the source/drain regions 126, 128. The source/ drain portions 130, 132 may form source/drain terminals of the final FET devices. In some examples, the first source/drain region 126 can be formed by an n-doped selective epitaxial silicon or silicon carbon process, using for instance P, As or Sb as dopants, whereas the second source/drain region 128 can be formed by a p-doped selective epitaxial silicon or silicon carbon process. In some examples, B or Ga may be used as dopants. The n-doped regions and the p-doped regions may be formed sequentially, such that the n-epitaxy is performed while the p-doped region is masked, and vice versa. Advantageously, the second spacer may act as a wall that facilitates separation between the n-type metal-oxide-semiconductor (NMOS) and the p-type metal-oxide-semiconductor (PMOS) devices formed in this process.

FIGS. 8-13 illustrate the formation of gate structures at the channel portions of the stacks. The FIGS. 8-13 show cross sections taken at the channel portions of the stacks, and behind the mask layer 124 as seen from the source/drain portions of FIG. 7. As such, the first FET region 10 is now the FET region to the right of the figures, and the second FET region 20 is illustrated to the left of the figures.

Figure 8:
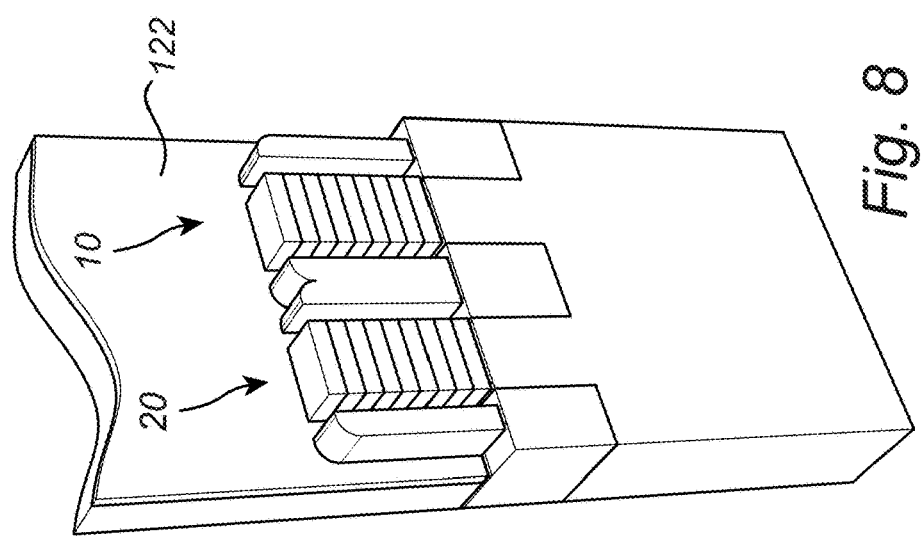

In FIG. 8, in the channel portions, the sacrificial gate (e.g., sacrificial gate 122 as described with reference to FIG. 5) has been removed, and the first spacers have been removed to reveal the channel portions of the stacks.

Figure 9:
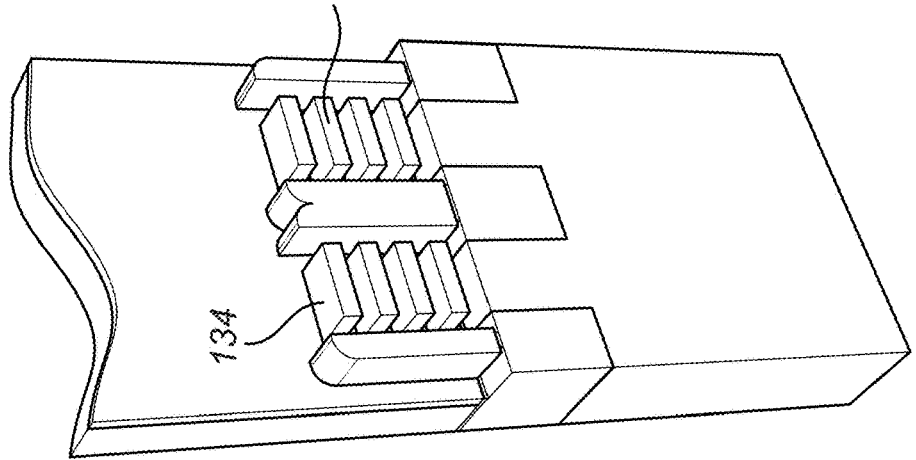

In FIG. 9, the sacrificial material layers and the top layers of the first and the second stacks have been removed to release the channel material layers 134 of the channel portions.

Figure 10:
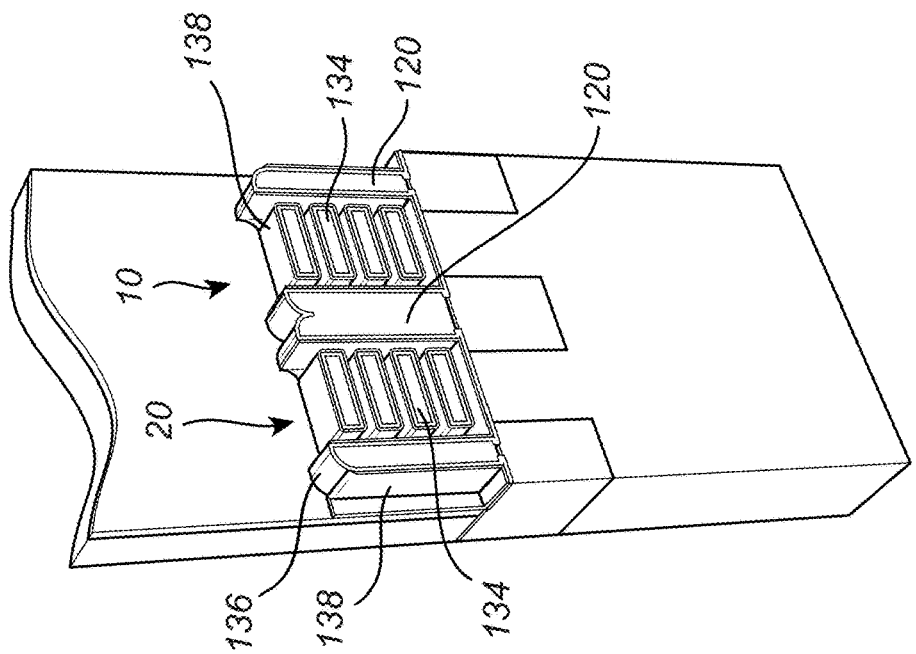

In FIG. 10, a highly dielectric material (high-κ material) 136, such as hafnium dioxide (HfO$_2$), hafnium silicate (HfSiO), lanthanum oxide (LaO), aluminum (II) oxide (AlO) and zirconium (II) oxide (ZrO), has been deposited at the released channel material layers 134 of the channel portions, and the second spacers (e.g., walls) 120 to form a gate oxide. Further, a p-type work function metal (p-WFM) 138, such as titanium nitride (TiN), tantalum nitride (TaN) or mixtures thereof, has been deposited covering the high-κ material 136 at the first FET region 10 and the second FET region 20. The deposition of the p-WFM 138 may for example be followed by a pull-back step, in which the p-WFM 138 is recessed below the level of the wall formed by the second spacer 120. The recessing may be performed by depositing a protecting mask layer, such as SiC, and recessing the mask layer by for instance dry etch below the level of the wall 120. The protecting mask layer can be used as a mask when the p-WFM above the level of the wall 120 is removed by for example isotropic etching.

Figure 11:
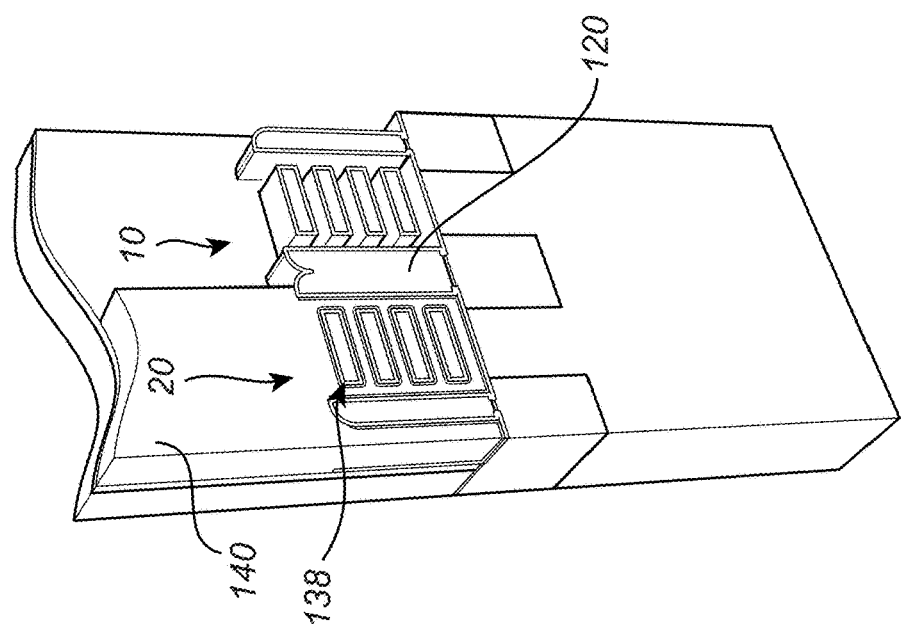

In FIG. 11, the p-WFM has been selectively removed from the first FET region 10, by use of a mask 140. In the figure, the mask 140 does not cover the entire wall 120, rather the wall 120 may act as part of an etch mask together with the mask 140, so that the etch may take place only at the first FET region 10. As such, using a wall 120 may allow increased tolerances in applying the mask 140. For example, in some instances, the wall 120 may provide a buffer zone, wherein as long as an end side of the mask 140 is located along the width of the wall 120, an etch may be performed on only the first FET region 10.

Figure 12:
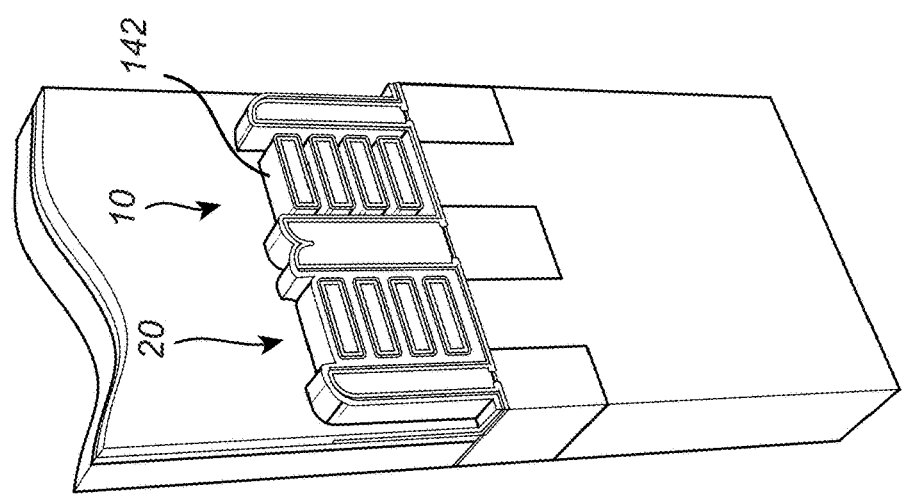

In FIG. 12, an n-type work function metal (n-WFM) 142, such as titanium aluminide (TiAl) or titanium aluminum carbide (TiAlC), has been conformally applied at the first 10 and second 20 FET regions.

Figure 13:
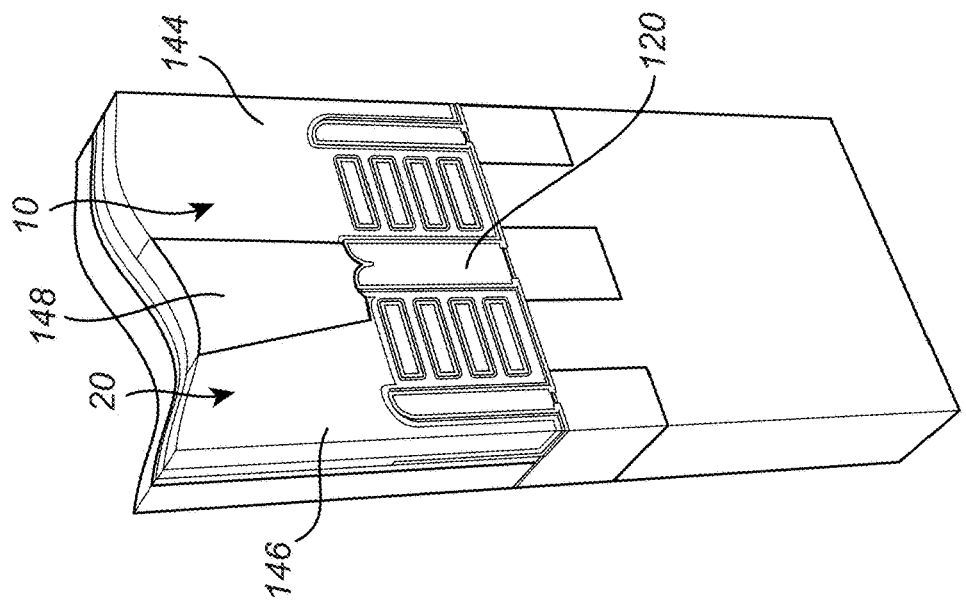

In FIG. 13, a first gate contact 144 has been formed contacting the first gate electrodes. A second gate contact 146 has been formed contacting the second gate electrodes. Further, an insulator 148 has been added separating the first gate contact 144 from the second gate contact 146.

For example, the gate contacts may be formed by applying a contact material covering both the first FET region 10 and the second FET region 20. A trench may be cut (e.g., a gate cut may be performed) separating the contact material covering the first FET region 10 and the second FET region 20 into the first gate contact 144 and the second gate contact 146. The gate cut may be facilitated by the wall 120. Firstly, in some embodiments in which the wall 120 protrudes above the top surface of the upper channel region, the gate cut may be shallower, as the cut may only need to reach the wall 120 in order to separate the gate electrodes from each other. Secondly, the wall 120 may once again act as a buffer zone for the width and placement of the gate cut, since as long as at least part of the wall is reached by the cut, the contacts may be electrically separated. Finally, the trench in the contact material can be filled with an insulating material 148, electrically separating the gate contact 144 of the first FET region 10 from the gate contact 146 of the second FET region 20.

FIGS. 14-17 schematically illustrate methods of forming semiconductor devices in accordance with different embodiments. FIGS. 14-17 each comprise cross sections taken along channel portions of three FET regions of two different semiconductor structures. FIGS. 14a-17a illustrate different stages of formation of a semiconductor device. FIGS. 14b-17b illustrate corresponding stages of formation of a different semiconductor device.

Figure 14A:
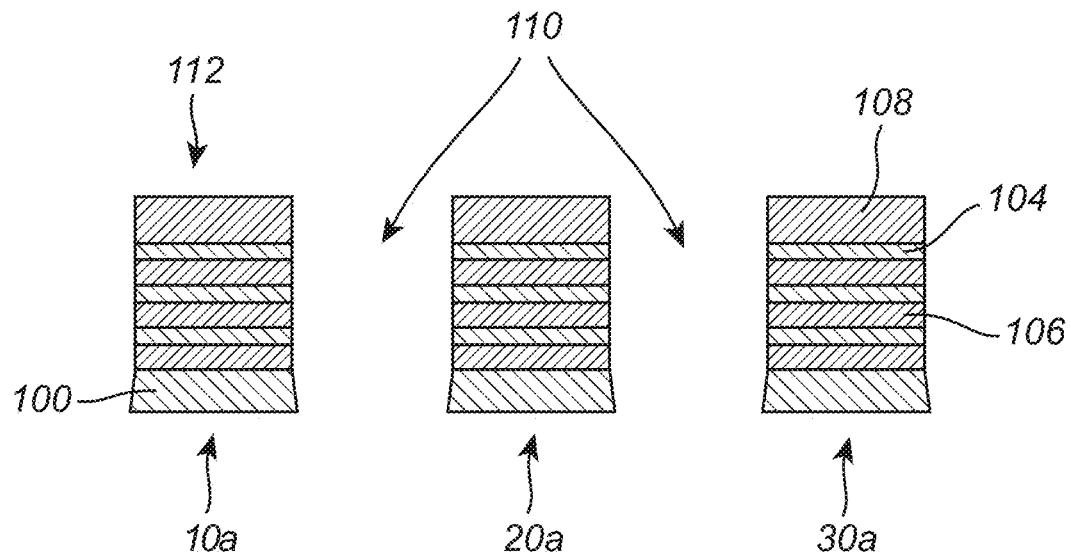
FIGS. 14a, 14b, 15a, 15b, 16a, 16b, 17a, and 17b illustrate various intermediate structures of methods of forming different semiconductor structures.
Figure 14B:
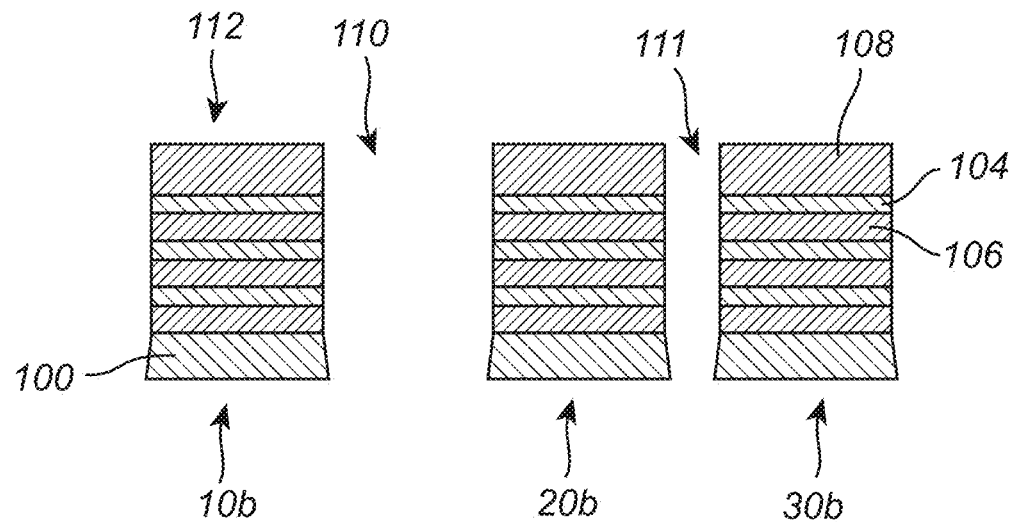

With reference to FIGS. 14a and 14b, a first stage of formation of the respective semiconductor devices will be described. The first stage may be similar to the stage described with reference to FIG. 2.

FIG. 14a shows a cross section taken along channel portions of three FET regions 10a, 20a, 30a. FIG. 14b shows a cross section taken along channel portions of three FET regions 10b, 20b, 30b.

The FET regions 10a-30a, 10b-30b each comprise a substrate 100 on which alternating channel material layers 104 and sacrificial material layers 106 are arranged forming stacks 112. Each stack 112 can comprise a top layer 108.

The stacks 112 of FIG. 14a are separated by trenches 110 of substantially equal width. For example, the trenches 110 separate the stack of the first FET region 10a from the stack of the second FET region 20a, and the stack of the second FET region 20a from the stack of the third FET region 30a.

In FIG. 14b, the stack of the first FET region 10b is separated from the stack of the second FET region 20b by a trench 110 which is similar to the trenches 110 in FIG. 14a. The stack of the second FET region 20b is separated from the stack of the third FET region 30b by a narrower trench 111.

Figure 15A:
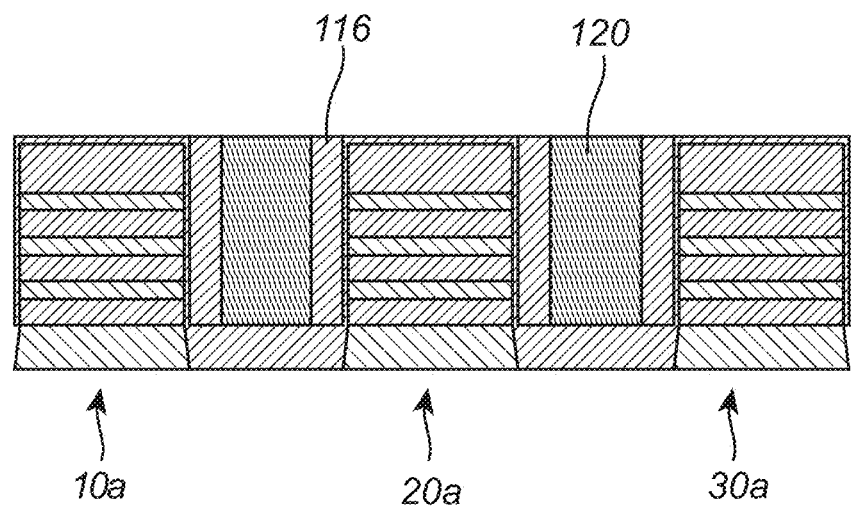
Figure 15B:
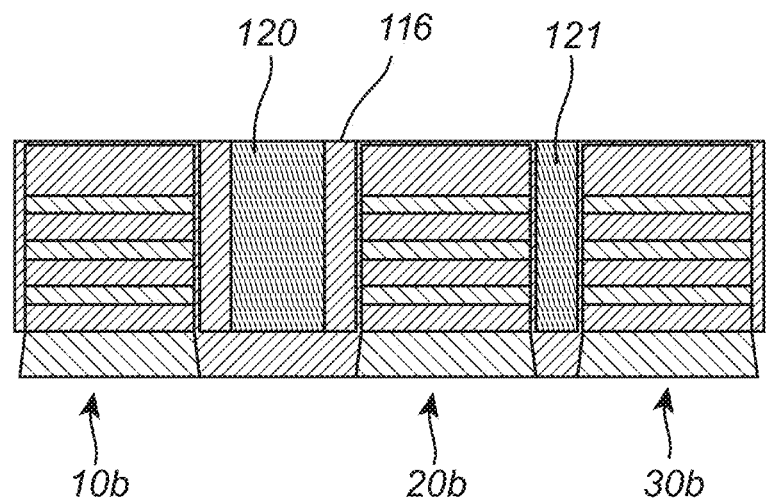

With reference to FIGS. 15a and 15b, a second stage of formation of the respective semiconductor devices will be described. The second stage may be similar to the stage described with reference to FIG. 4.

In FIG. 15a, first spacers 116 have been formed on sidewalls of the trenches. Second spacers 120 have been formed in the trenches, filling the gap between the first spacers 116.

In FIG. 15b, first spacers 116 have been formed on sidewalls of the trench separating the first FET region 10b and the second FET region 20b. A second spacer 120 has been formed filling the gap between the first spacers 116 in the trench. A further second spacer 121 has been formed filling the narrower trench. For example, no first spacers have been formed in the narrower trench.

The first spacers 116 and second spacers 120, 121 may be similar to the first 116 and second spacers 120 described above with reference to FIGS. 3 and 4.

Figure 16A:
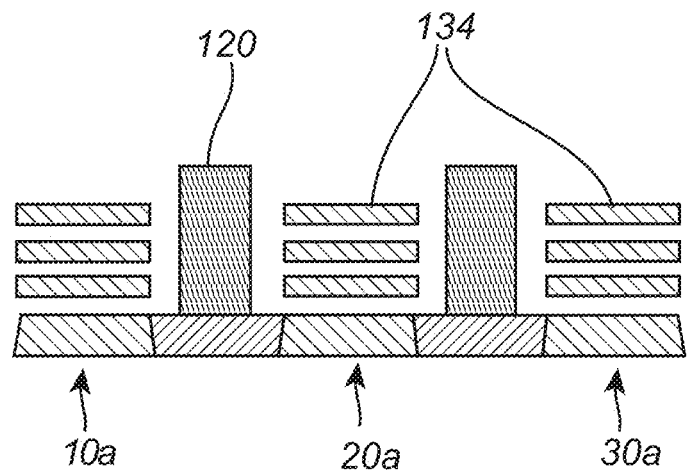
Figure 16B:
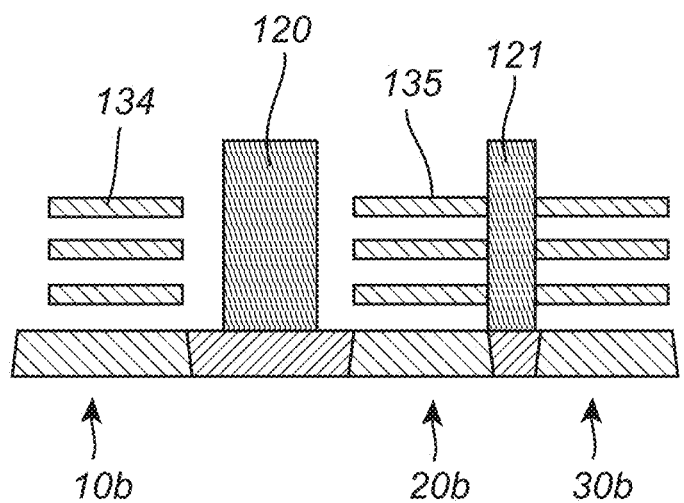

With reference to FIGS. 16a and 16b, a third stage of formation of the respective semiconductor devices will be described. The third stage may be similar to the stage described with reference to FIG. 9.

In FIG. 16a, the first spacers and the sacrificial material layers, including the top layers of the stacks, have been removed, leaving fully released channel material layers 134 (e.g., channel portions) in the channel regions of each of the FET regions 10a, 20a, 30a. The second spacers 120 are left, forming walls between neighboring FET regions.

In FIG. 16b, the first spacers and sacrificial material layers, including the top layers of the stacks, have been removed. As the first spacers have been removed, the channel material layers 134 of the first FET region 10b can be fully released. The channel material layers 135 of the second and third FET regions 20b, 30b are only partly released, as no first spacers were formed at the sidewalls of the narrow trench. One side of each of the channel material layers 135 in the channel regions of the second and third FET regions 20b, 30b can be attached at the further second spacer 121 (e.g., wall) which separates the second FET region 20b from the third FET region 30b. The channel regions of the second FET region 20b and third FET region 30b can form a forklike structure together with the wall 121.

Figure 17A:
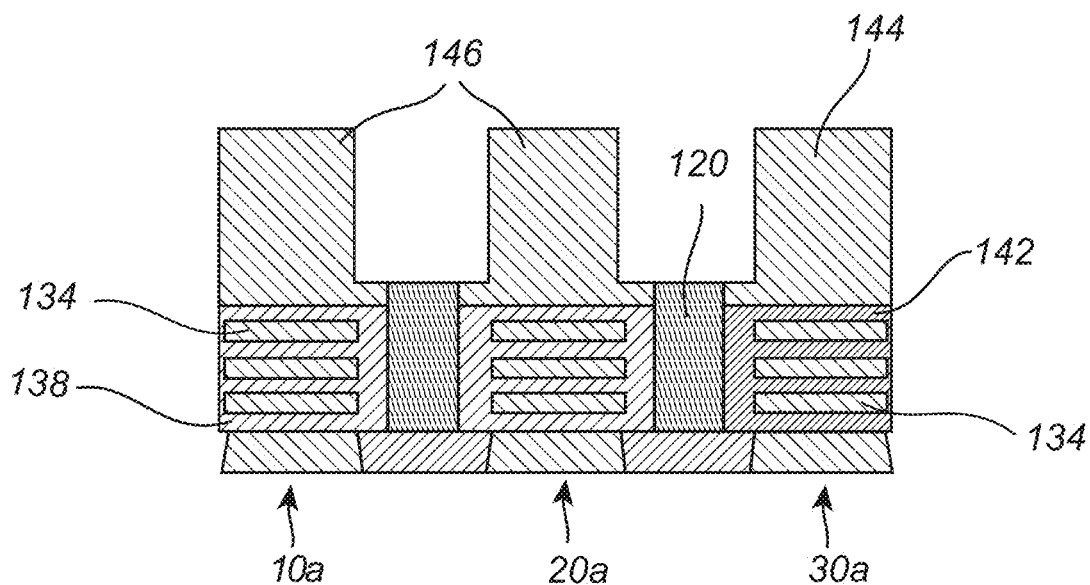
Figure 17B:
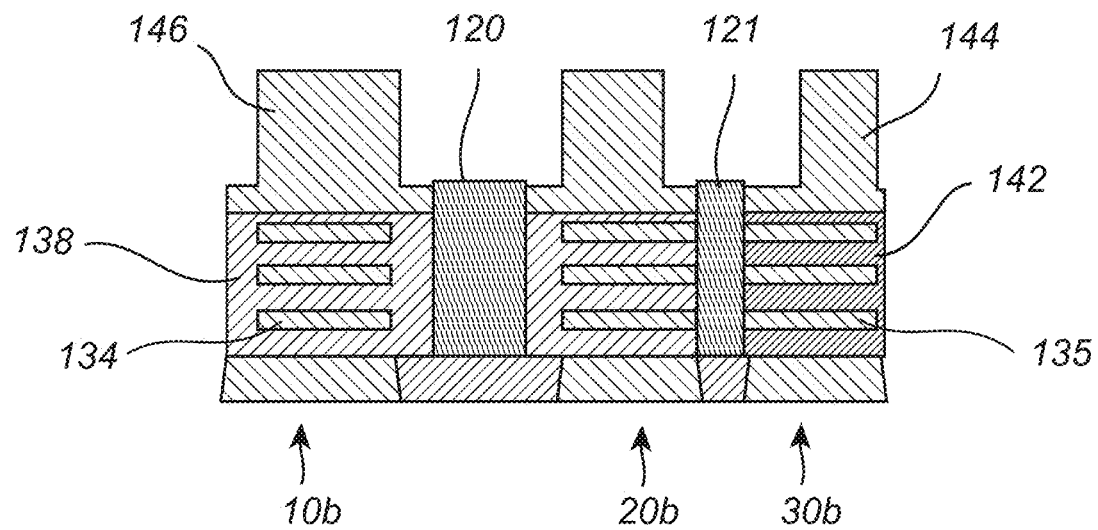

With reference to FIGS. 17a and 17b, a fourth stage of formation of the respective semiconductor devices will be described. The fourth stage may be similar to the stage described with reference to FIG. 13.

In FIG. 17a, a p-type work function metal 138 (p-WFM) has been deposited wrapping all around the channel portions 134 of the first and second FET regions 10a, 20a. An n-type work function metal 142 (n-WFM) has been deposited wrapping fully around the channel portions 134 of the third FET region 30a. As the p-WFM 138 and the n-WFM 142 wrap all around the channel portions 134 of the FET regions, the resulting FET devices may be referred to as gate-all-around (GAA) FET devices, which can be separated by the second spacers 120 (e.g., walls). A gate contact 144 can be formed providing control of the gate of the FET device formed at the third FET region 30a. Gate contacts 146 have also been formed providing control of gates of the first and second FET regions 10a, 20a, respectively. GAA FET devices may provide an improved control of the FET device at a lower operating voltage.

In FIG. 17b, a p-WFM 138 has been deposited wrapping partly around the channel portions of the first and the second FET regions 10b, 20b. A n-WFM 142 has been deposited wrapping partly around the channel portions of the third FET region 30b. Further, a gate contact 144 has been formed providing control of the gate of the FET device formed at the third FET region 32. Gate contacts 146 have also been formed providing control of gates of the first and second FET regions 12, 22 respectively.

The resulting semiconductor device may comprise three FET devices each separated from the neighbouring FET device(s) by a wall formed by the second spacers 120, 121. As the work functions materials (n-WFM 138, and p-WFM 142) do not wrap fully around the channel portions of the FET devices, the spacing between the FET devices may be smaller than in the GAA FET device described with reference to FIG. 17a.

The n-WFM 138 and the p-WFM 142 may be similar to the n-WFM 138 and p-WFM 142 described above with reference to FIGS. 11 and 12.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a semiconductor device, comprising:
  forming a first field-effect transistor (FET) device comprising a first semiconductor structure including a first source region, a first drain region, a first channel portion extending horizontally between the first source and drain regions, and a first gate structure at least partly wrapping around the first channel portion;
  forming a second FET device comprising a second semiconductor structure including a second source region, a second drain region, a second channel portion extending horizontally between the second source and drain regions, and a second gate structure at least partly wrapping around the second channel portion; and
  forming a third FET device comprising a third semiconductor structure including a third source region, a third drain region, a third channel portion extending horizontally between the third source and drain regions, and a third gate structure partly wrapping around the third channel portion;
  wherein forming the first and second FET devices comprises:
  forming, on a semiconductor substrate, a first stack and a second stack separated by a trench, wherein each of the first and second stacks comprises a first layer arranged on a second layer, wherein the first layer comprises a channel material forming the respective first and second semiconductor structures, and wherein the second layer comprises a sacrificial material;
  forming, in the trench, first spacers at sidewalls of the first and second stacks;
  forming a second spacer between the first spacers;
  forming a sacrificial gate extending across the first and second channel portions, the first spacers and the second spacer;
  recessing the sacrificial material at the first and second source and drain regions;
  forming first and second source and drain portions at the first and second source and drain regions, respectively;
  removing the sacrificial gate;
  removing the first spacers;
  etching the sacrificial material of the first and second stacks to form at least partly released first and second channel portions of the channel material; and
  forming first and second gate structures at least partly wrapping around respective ones of the at least partly released first and second channel portions, the first gate structure of the first FET device being separated from the second gate structure of the second FET device by the second spacer;

wherein forming the third FET device comprises:
  forming, on the semiconductor substrate, a third stack separated from the second stack by a second trench, wherein the third stack comprises a first layer arranged on a second layer, wherein the first layer comprises a channel material forming the third semiconductor structure, and wherein the second layer comprises a sacrificial material;
  forming a further second spacer filling the second trench without a further first spacer;
  forming the sacrificial gate across the third channel portion and the further second spacer; and
  etching the sacrificial material of the third stack to form a partly released third channel portion of the channel material; and
  wherein the second gate structure of the second FET device is separated from the third gate structure of the third FET device by the further second spacer with the partly released third channel portion forming a forklike structure with the further second spacer.

2. The method according to claim 1, wherein another first spacer is also formed at the first stack at a sidewall facing away from the trench, and wherein the first gate structure is formed wrapping completely around the released first channel portion.

3. The method according to claim 1, wherein each of the first and second channel portions is a nanosheet or a nanowire.

4. The method according to claim 1, wherein each of the first and second stacks comprises a plurality of channel material layers and a plurality of sacrificial material layers forming a superlattice.

5. The method according to claim 1, wherein the second spacer is formed to fill a gap between the first spacers.

6. The method according to claim 1, wherein the first and second source and drain portions are formed by epitaxial growth.

7. The method according to claim 1, wherein the first FET device is an n-type device and the second FET device is a p-type device.

8. The method according to claim 7, wherein forming the first and second gate structures comprises:
  forming an p-type effective work function metal (WFM) on the first and second channel portions;
  selectively removing the p-type WFM from the second channel portion;
  forming an n-type WFM on the second channel portion; and
  forming a first gate electrode contacting the first channel portion and a second gate electrode contacting the second channel portion.

9. The method according to claim 1, wherein forming the first stack and the second stack comprises:
  providing the first layer and the second layer in the shape of a fin; and
  cutting the fin into the first stack and the second stack via the trench.

10. The method according to claim 1, further comprising:
  prior to forming the first spacers, providing a sacrificial layer of sacrificial material on top of the first and second stacks; and
  removing the sacrificial layer after the forming of the second spacer, such that the second spacer protrudes above a surface level of the remaining first and second stacks.

11. The method according to claim 1, wherein the channel material is silicon and the sacrificial material is silicon germanium.

12. A semiconductor device, comprising:
  a first field-effect transistor (FET) device comprising a first channel portion extending horizontally between source and drain portions of the first FET device, and a first gate structure at least partly wrapping around the first channel portion;
  a second FET device comprising a second channel portion extending horizontally between source and drain portions of the second FET device, and a second gate structure at least partly wrapping around the second channel portion; and
  a third FET device comprising a third channel portion extending horizontally between source and drain portions of the third FET device, and a third gate structure partly wrapping around the third channel portion;
  wherein the first FET device and the second FET device are arranged beside each other on a substrate and separated from each other by a spacer;
  wherein the spacer is arranged between the first FET device and the second FET device and at a distance from the first and second channel portions; and
  wherein the second gate structure is separated from the third gate structure by a further spacer with the third channel portion forming a forklike structure with the further spacer.

13. The semiconductor device according to claim 12, wherein:
  the first FET device comprises a plurality of first channel portions arranged above each other, and wherein the first gate structure at least partly wraps around each of the plurality of first channel portions;
  the second FET device comprises a plurality of second channel portions arranged above each other, and wherein the second gate structure partly wraps around each of the plurality of second channel portions.

14. The semiconductor device according to claim 12, wherein the spacer is arranged to protrude above a surface level of the first and second gate structures.

15. The semiconductor device accordingly to claim 12, wherein the first gate structure completely wraps around the first channel portion.

16. The semiconductor device according to claim 12, wherein each of the first and second channel portions is a nanosheet or a nanowire.

17. The semiconductor device according to claim 12, wherein the first FET device is an n-type device and the second FET device is a p-type device.

* * * * *